United States Patent [19]

Ziger

[11] Patent Number: 4,814,243
[45] Date of Patent: Mar. 21, 1989

[54] THERMAL PROCESSING OF PHOTORESIST MATERIALS

[75] Inventor: David H. Ziger, Lawrenceville, N.J.

[73] Assignee: American Telephone and Telegraph Company, New York, N.Y.

[21] Appl. No.: 93,656

[22] Filed: Sep. 8, 1987

[51] Int. Cl.4 ............................................... G03C 5/00
[52] U.S. Cl. ...................................... 430/30; 430/325; 430/326; 430/330; 430/394
[58] Field of Search ................. 430/30, 325, 326, 327, 430/328, 330, 394, 296, 313, 317, 322, 323

[56] References Cited

U.S. PATENT DOCUMENTS

| | | | |
|---|---|---|---|
| 4,456,679 | 6/1984 | Leyrer et al. | 430/330 |
| 4,567,132 | 1/1986 | Fredericks et al. | 430/330 |
| 4,568,631 | 2/1986 | Badami et al. | 430/325 |
| 4,569,717 | 2/1986 | Ohgami et al. | 430/30 |
| 4,624,910 | 11/1986 | Takeda | 430/330 |
| 4,647,172 | 3/1987 | Batchelder et al. | 430/30 |
| 4,717,645 | 1/1988 | Kato et al. | 430/296 |

FOREIGN PATENT DOCUMENTS 0056331 7/1983 Japan ...................................... 430/30

Primary Examiner—George F. Lesmes
Assistant Examiner—Donald J. Loney
Attorney, Agent, or Firm—Roderick B. Anderson

[57] ABSTRACT

In an image reversal process (12), a photoresist coating on a wafer is baked in an oven (19) in the presence of amine gas to fix the exposed photoresist portion (14). A computer (21) is programmed with a characterization of the photoresist film. The output of a temperature sensing element (23) mounted on the wafer is directed to the computer which, in response, controls introduction of the amine gas and withdrawal of the wafer after a predetermined extent of reaction in the coating.

10 Claims, 3 Drawing Sheets

THERMAL PROCESSING OF PHOTORESIST MATERIALS

TECHNICAL FIELD

This invention relates to methods for making semiconductors devices, and more particularly, to the processing of a photoresist films used in such fabrication.

BACKGROUND OF THE INVENTION

Photolithographic masking and etching is a fundamental process in the fabrication of semiconductor devices such as integrated circuits. A semiconductor wafer to be fabricated is coated with a thin layer of photoresist material and is exposed to actinic light through a patterned photomask. After development, the remaining photoresist film acts as a mask to permit selective processing, such as selective doping or etching, of the wafer.

The development of denser and more complex integrated circuits has placed increasingly higher demands on the image resolution capabilities of the photoresist film. One method for increasing resolution is known as image reversal processing which is described, for example, in the publications (a) "The Production of a Negative Image in Positive Photoresist," S. MacDonald, R. Miller, C. Willson, *Proceedings of the* 1982 *Kodak Microelectronics Seminar*, San Diego, Calif.;

(b) "Optimization of Image Reversal of Positive Photoresist," C. Hartglass, *Proceedings of the* 1985 *Microelectronics Seminar*, San Diego, Calif.;

(c) "Image Reversal of Positive Photoresist: A New Tool for Advancing Integrated Circuit Fabrication," E. Alling and C. Stauffer, *SPIE Advances in Resist Technology and Processing II*, Vol. 539, pp. 195–218 (1985); and (d) "Positive Photoresist Enhancement Options," P. Burggraff, *Semiconductor International*, April, 1987, pp. 84–91, at pp. 88–89.

With this process, a substrate coated with photoresist film is selectively exposed to actinic light through a mask and is then baked in an oven in the presence of amine gas. The baking step causes a chemical reaction in the portion of the film that had been exposed to actinic light, which causes it to be insoluble in a base solution as would normally be the case. After the baking step, the film is exposed to a flood of actinic light, which affects only the previously unexposed portion. Thereafter, the film is developed by selectively dissolving in a base solution the portion of the film that had originally been masked. This creates a photographic "negative" of the original image rather than a "positive" and it can be shown that, all other things being equal, the resolution of such image can be made to be sharper than that by conventional photoresist processing.

One drawback of image reversal processing is that the baking step somewhat desensitizes the unexposed film portion, which may reduce the resolution that could otherwise be obtained. Furthermore, the extent of such desensitization, and the extent of the chemical reaction in the exposed portion, typically vary from one batch to another so that the improved resolution results are not dependably predictable or reproducible.

SUMMARY OF THE INVENTION

In order to enhance the resolution and the reproducibility obtainable from image reversal processing in accordance with the invention, a computer is programmed with information describing the required reaction within the film resulting from the application of heat in the environment. A temperature sensing element such as a thermocouple is mounted on the wafer prior to baking. During the baking step, the output of the thermocouple is directed to the computer so that the quantity of heat provided to the photoresist film is monitored by the computer, and also to introduce amine gas at the proper time. After an appropriate amount of heat has been applied to the photoresist film to cause a predetermined extent of reaction, the computer controls withdrawal of the substrate from the oven.

As will be appreciated from the detailed description below, use of the invention obviates the need for careful control of nominal oven temperature for successive baking steps. For example, even if the oven temperature were significantly higher than one would normally use for the baking step, the computer would cause withdrawal of the substrate after a somewhat shorter lapse of time to give exactly the desired reaction within the film.

DETAILED DESCRIPTION

Figure 1:
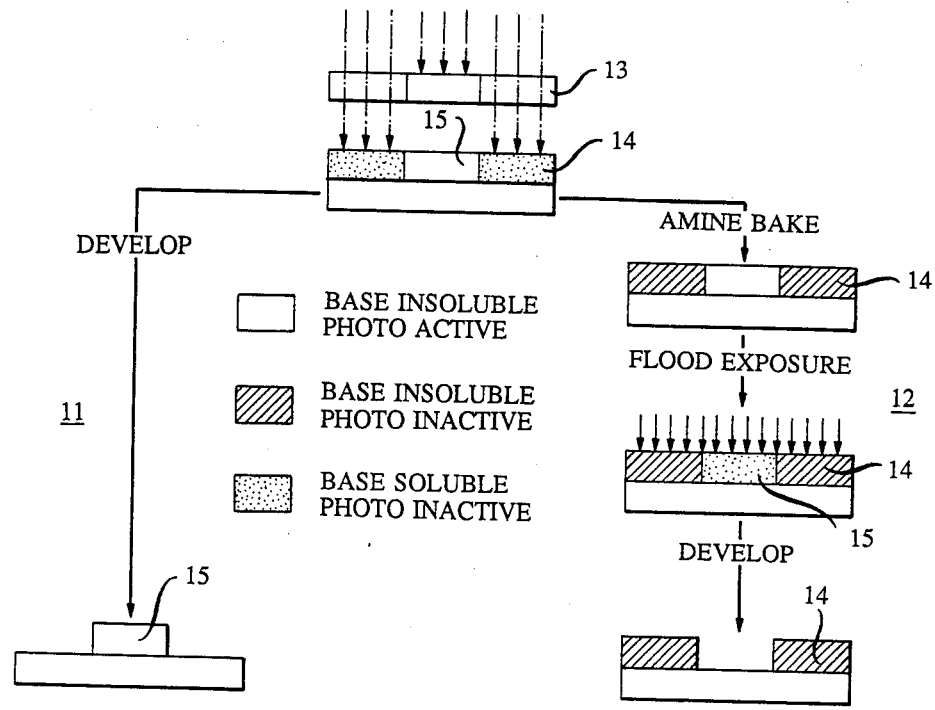
FIG. 1 is a schematic drawing illustrating conventional processing and image reversal processing in accordance with the prior art.

Referring to FIG. 1, the conventional photoresist development process is shown at 11 to compare it with the image reversal process shown at 12. In either case, the photolithographic mask 13 selectively exposes a portion 14 of photoresist film to actinic light while leaving another portion 15 unexposed. The exposure makes film portion 14 soluble in a base and insensitive to light, or photo inactive as designated by the legend. Unexposed portion 15 is insoluble in a base and remains photo active. Thus, with conventional method 11, the film is developed by immersing it in a base solution which dissolves the light-exposed portion 14, leaving only the portion 15, which constitutes a positive image of the original mask 13.

With the image reversal processing 12, the partially exposed photoresist is baked in the presence of an amine gas which converts the light-exposed portion 14 from a base-soluble material to a material which is insoluble in a base. The entire photoresist layer is then flooded with actinic light, which converts film portion 15 to a material which is soluble in a base. The film is developed by immersing it in a base which dissolves the base-soluble portion 15, leaving the portion 14 which had originally been exposed to light through the mask 13. Thus, the pattern of portion 14 constitutes a "negative" of the mask 13; it also constitutes a "reverse image" of the "positive" image produced by conventional method 11.

The exposure of the photoresist through mask 13 is believed to create a carboxylic acid constituent in photoresist portion 14 which in turn renders film portion 14 soluble in a base solution. An important step in image reversal processing is the amine-bake step which causes a reaction in the film portion 14 that neutralizes the carboxylic acid constituent. Other reactions are believed to also take place which contribute to the insolubility in a base solution, but it is a neutralization of the carboxylic acid (perhaps via decarboxylation) that is believed to be primarily responsible for making portion 14 base insoluble.

While the reverse imaging process is more complex than the conventional photoresist development process, it has been found to offer advantages of higher resolution, which is important as the linewidth requirements for semiconductor fabrication become processively more stringent. However, it has been observed that these higher resolution capabilities are not accurately reproducible from one process to the next. My experiments have shown that this problem is not due to differences in chemistry of the commercially available photoresist, but results primarily from unavoidable heat treatment variations from wafer to wafer and batch to batch. If the wafer is baked too long, the unexposed photoresist will be desensitized to light, whereas if the baking is insufficient, there will not be a sufficiently decarboxylation. Moreover, if heat treatments are not closely reproduced, then wafer to wafer developing rates will vary substantially, yielding poor linewidth control. This problem is overcome by using the apparatus of FIG. 2 for the amine-bake step illustrated in FIG. 1.

Figure 2:
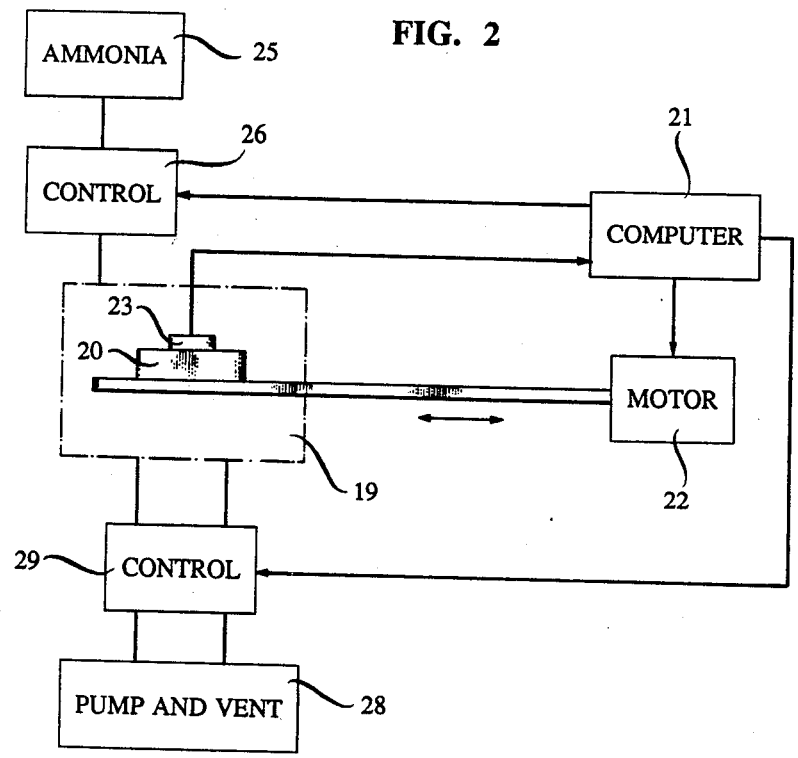
FIG. 2 is a schematic drawing of apparatus for baking the photoresist coating on a substrate in accordance with an illustrative embodiment of the invention.

FIG. 2 shows schematically an oven 19 for baking a substrate 20 coated with photoresist film which is to be developed in accordance with the image reversal process. A computer 21 is programmed with information describing the reaction caused by the amine heat treatment on the photoresist, i.e., the kinetics of the reaction. The computer 21 controls a motor 22 which in turn controls the entry to, and withdrawal from, oven 19 of substrate 20. A thermocouple 23 mounted on the photoresist film transmits the temperature of the photoresist film to computer 21. The computer also controls introduction into the oven of ammonia from a source 25 by way of control element 26, as well as controlling pump and vent apparatus 28 by way of control element 29.

As soon as the substrate 20 has entered the oven 19, all temperature changes are monitored by the thermocouple 23 and recorded in computer 21. When a threshold temperature is recorded by the thermocouple 23, control 26 is actuated to introduce into the oven amine gas from source 25. The computer monitors the total heat applied to the photoresist and the time of exposure to the amine gas. Pump and vent apparatus 28 are controlled by the computer through control element 29 so that the total time of exposure to the amine gas can be kinetically controlled, and the substrate 20 can be automatically withdrawn by actuation of the motor 22.

The computer 21 must, of course, be programmed with appropriate information to control the various functions. In general, kinetic information concerning the effect of the amine bake on developing rates of both the exposed and unexposed regions would be most straightforward; the wafer would be extracted from the reactor when the fractional neutralization in the exposed regions reached a predetermined value.

Alternatively, another suitable method for kinetic control is to withdraw the wafer after the unexposed resist has undergone a predetermined amount of decomposition. This is advantageous because:

1. The reaction in the unexposed areas constitutes a valid measure of the reaction in the exposed since both are expected to be exothermic with similar activation energies.

2. Kinetic studies are available for diazoquinone sensitizers commonly used as the photoresist material or can be developed using standard analytical tools.

3. Decomposition kinetics of resists based on diazoquinone sensitizers should be similar and should be approximately proportioned to the reversal reaction.

Consequently, the computer 21 must be programmed with appropriate kinetic data either in tabular or analytical form. In the absence of kinetic tables in the form of rate versus temperature, we can model the decomposition generally as:

$$\frac{dc}{dt} = g(T)f(c) \quad (1)$$

where t is time, g(T) is a function only of temperature, and f(c) is a function only of concentration. Transposing and integrating:

$$\int_{c_o^d}^{c_f^d} \frac{dc}{f(c)} = \int_0^{t_f} g(T)dt \quad (2)$$

where $c_o^d$ and $c_f^d$ are the initial and final concentration of the unexposed photoactive compound and $t_f$ is the final time. Equation (2) shows that a desired final concentration $c_f^d$ can be obtained by choosing a proper final time $t_f$ and then withdrawing the water (hereinafter, superscript d shall refer to the unexposed photoactive compound).

Before advantage can be taken of equation (2), the functions g(T) and f(c) must be characterized. The simplest assumptions are an Arrhenius form (Eq. 3) for g(T) and first order decomposition kinetics for f(c) (Eq. 4):

$$g(T) = A^d \exp \frac{-E_a^d}{RT} \quad (3)$$

$$f^d(c) = -kc^d \quad (4)$$

where $A^d$ and $E_a^d$ are the Arrhenius pre-exponential factor and activation energy respectively for diazoquinone decomposition and $R_T$ is the product of the absolute temperature T and gas constant R. For example, for a photoresist known as AZ-2400, $A^d = 1.15 \times 10^7 \text{ sec}^{-1}$, and $E_a^d = 19.2$ kcal/mole have been measured.

Combining equations (3), (4), and (1) and integrating:

$$\ln \frac{c_f^d}{c_o^d} = \int_0^{t_f} - A^d \exp \frac{-E_a^d}{RT} dt \quad (5)$$

Note that $c_f^d/C_o^d$ is the fractional conversion (decomposition) of the photoactive compound. Programming the computer to withdraw the wafer after decomposition to desired fractional concentration $C_f^d/C_o^d$ would then be well within the skill of a worker in the art. Decomposition of the photoactive compound to $C_f^d/C_o^d$ assures decarboxylation in the exposed portion 14, but such decomposition is chosen to be minimized so as to maximize the sensitivity of portion 15 to the second light exposure.

Maximizing the photoactive compound concentration $C_f^d$, in the resist after image reversal, while insuring neutralization of the exposed areas, is most conveniently accomplished by determining the minimum amine bake conditions for making base-insoluble the exposed portion 15. This can be found by determining the effect of various bake conditions on the final thickness of exposed and unexposed photoresist after postamine flood exposure and base development. To accomplish this, various silicon samples are coated with the same photoresist and a sufficiently large area is exposed on each sample using the same wavelength and exposure time. The samples are given various amine bake treatments, such as different bake times, oven temperatures and thresholds before flood exposing and developing. The final film thicknesses $T_e$ of the initially exposed areas and the final film thickness $T_u$ of the initially unexposed areas are measured, and the final normalized film thickness $T_N$ can be computed:

$$T_N = \frac{T_e - T_u}{T_i} \quad (6)$$

where $T_i$ is the average initial film thickness. For incomplete amine treatments, exposed areas are only partially developed making $T_N$ somewhat less than unity. Minimum amine treatments provide $T_N$ values of 1. If the thermal processing is too harsh, then the initially unexposed areas will not develop ($T_u > 0$) and $T_N$ would again be less than unity. A plot of $T_N$ versus treatment time at a particular temperature would show a $T_N$ increase to 1, a level portion, and finally a decrease for very long treatment times.

To compare $T_N$ values from various heat treatments (threshold temperatures, oven temperatures and treatment times) and to compensate for heatup times, the following procedure is suggested to correlate $T_N$. First, assume that the amine reversal reaction is also first order with an Arrhenius temperature dependence:

$$\frac{dc^a}{dt} = -A^a \exp\left(\frac{-E_a^a}{RT}\right)c \quad (7)$$

where $A^a$ and $E_a^a$ are Arrhenius parameters for the amine catalyzed neutralization of carboxylic acid (the superscript a refers to the initially exposed photoactive compound undergoing an amine treatment and the kinetic parameters $A^a$ and $E^a$). If the temperature profile $T_{(t)}$ is monitored and the Arrhenius parameters $A^a$ and $E_a^a$ are known, Eq. (7) can be integrated from the start to finish of the amine treatment:

$$\ln\frac{c_f^a}{c_0^a} = -A^a \int_{t=t_0}^{t=t_f} \exp\left(\frac{-E_a^a}{RT}\right)dt \quad (8)$$

Figure 4:
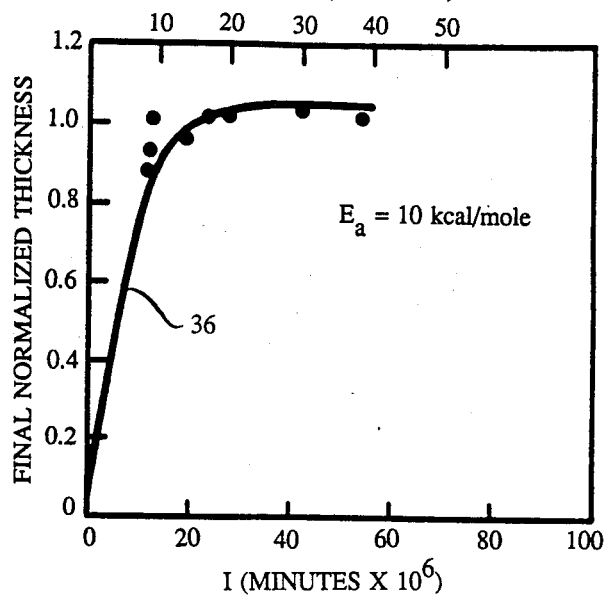
FIGS. 4 and 5 are graphs of normalized photoresist thickness after development versus amine-bake time in the apparatus of FIG. 2.
Figure 5:
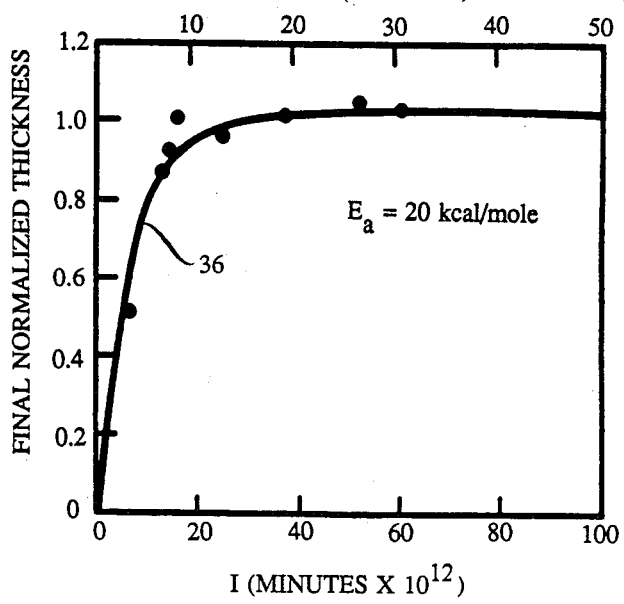

Since the right hand side of Eq. (8) defines the kinetics of the amine treatment, it is reasonable that is should correlate $T_N$ independent of amine treatment time, oven temperature, threshold temperature or heat up rate, provided that $T_{(t)}$ is monitored. Furthermore, if the Arrhenius parameters are not known, then Eq. 8 can still be used to correlate $T_N$ values for reasonable values of $E_a^a$ using $$I = \int_{t=t_0}^{t=t_f} \exp\left(\frac{-E_a^a}{RT}\right)dt$$

where I is an exponentially weighted time integral having time units. Curves 36 in FIGS. 4 and 5 show the correlation between I and $T_N$ for 10 and 20 kcal/mole neutralization activation energies. Finaly, these $T_N$ data can be used to calculate equivalent isothermal amine treatment times at particular temperatures. For example, a minimum equivalent amine heat treatment of 18-20 minutes is required at 100° C. to insure that the initially exposed areas becomes insoluble assuming $E_a^a = 20$ kcal/mole. Equivalent times at other temperatures can be similarly estimated. Note, $A^a$ need not be known and $E_a^a$ needs only to be estimated to correlate $T_N$ data.

This demonstrates that one can make an estimate of $E_a$, at least for the purpose of solving equation (6), so as to estimate the minimum time t needed to fix the initially unexposed layer 15; then one can maximize $c_t$ in solving equation (5). FIGS. 4 and 5 illustrate that, for this purpose, the estimate of $E_a$ may be quite gross, i.e., varying as much as a factor of two, and still yield a satisfactory result.

Once the parameter $c_f^d$ is determined and the computer program is devicsed based on equation (5), consistency is assured, regardless of the actual temperatures of the oven; if the oven temperature is higher, the wafer is automatically withdrawn after a shorter time. Further, if the oven temperature is higher, the amine-bake cycle of FIG. 3 commences earlier because the threshold wafer temperature is reached sooner. With batch processing, one could offset the effects of oven temperature gradients by having a separate thermocouple and separate withdrawing mechanism for each wafer. In practice, I use the process with wafer batches and include a number of thermocouples merely for monitoring any temperature gradients, and withdrawing the entire batch based on average wafer temperature. If the oven temperature gradient is within a tolerable limit, the variation within the batch will be tolerable and my experience is that, on this basis, batch processing is usually practical without individual wafer control.

As mentioned before, kinetic data either in tabular or analytical form may be used to control the process. This invention does not assume any particular kinetic form. Certain materials could be modeled using two activation energies while others may require tabular listing as a function of temperature and/or pressure. Kinetic data adequately describing the amine catalyzed neutralization reaction may also be used to control the process, perhaps using Eq. 8 as a guide. In fact, certain materials have two or more temperature-dependent activation energies, and in such cases the computer can be programmed, for example, with a first activation energy for temperatures below a threshold temperature and a second activation energy for temperatures above the threshold.

It is apparent that the invention is applicable wherever a photoresist layer must be baked as part of its processing, and is not limited to image reversal processing. For example, photoresist materials are typically contained in a liquid solvent or carrier, which makes them easier to apply uniformly to wafer surfaces. The wafers are then baked for the purpose of driving off the liquid carrier and to stabilize the photoresist on the wafer surface. Such baking must not impart so much heat to the film as to desensitize it to light; one can compute a value $c_t$ for equation (5) which, when reached, will result in a drive-off of the carrier, but which is maximized, as before, to minimize decomposition of the diazo sensitizer with resulting light densensitization.

The invention is also applicable to other radiation-sensitive materials that are used in a like manner, such as electron beam resists and x-ray resists. For convenience and clarity, "photoresist" as used herein should be taken as including any radiation-sensitive materials such as electron beam resists and x-ray resists, and "light" or "actinic light" should be taken as including any actinic radiation including electron and x-ray radiation.

Numerous other embodiments and modifications may be made by those skilled in the art without departing from the spirit and scope of the invention.

What is claimed is:

1. A method for making devices comprising the steps of coating a substrate with a radiation sensitive film, masking a first portion of the film and exposing an unmasked second portion to first actinic radiation, baking the film in oven for a time and at a temperature to react substantially certain constituents of the film produced by the first actinic radiation in the second portion of the radiation-sensitive film, withdrawing the substrate from the oven and exposing the radiation-sensitive film to second actinic radiation to which only the first portion of the film is sensitive, developing the radiation-sensitive film, and using the developed film as a mask for selectively processing the substrate, characterized by the steps of:

programming a computer with information describing the extent of the reaction and consequent decomposition of certain compounds within the film resulting from heat application;

mounting a temperature-sensing element on the radiation-sensitive film and directing the output of the temperature sensing element to the computer during the baking step; and using the computer to control withdrawal of the substrate from the oven in accordance with the information programmed, temperature information from the temperature-sensing element, and elapsed time, such that the substrate is withdrawn when a predetermined extent of reaction is reached.

2. The method of claim 1 further characterized by the step of:

using the computer to control introduction into the oven of amine gas in response to a signal from the temperature-sensing element indicating a threshold value of substrate temperature.

3. The method of claim 2 further characterized in that:

the first actinic radiation produces carboxylic acid in the second portion of the film; and the steps of baking and introducing amine gas controllably decompose such carboxylic acid.

4. The method of claim 3 further characterized in that:

the second actinic radiation produces carboxylic acid in the first portion of the film; and the developing step selectively dissolves the first portion of the film while leaving the second portion substantially intact.

5. The method of claim 2 further characterized in that the programming step comprises the step of characterizing the decomposition of a photoactive compound in the first portion of the film in response to applied heat so that when such photoactive compound decomposition reaches a predetermined value, the substrate is withdrawn from the oven.

6. A method for making devices including thereon a pattern comprising the steps of coating a body with a radiation-sensitive coating, masking part of the coating with a mask describing the pattern, exposing part of the coating to actinic radiation directed through the mask, developing the radiation-sensitive coating so as to define thereon the pattern, and using the pattern to process selectively the body, characterized by the steps of:

baking the radiation-sensitive coating on the body;

programming a computer with information characterizing a reaction in the radiation-sensitive coating in response to applied heat;

mounting a temperature sensing element on the radiation-sensitive film and directing the output of the temperature sensing element to the computer during the baking step; and using the computer to control withdrawal of the substrate from the oven when the extent of reaction has reached a predetermined value.

7. The method of claim 6 further characterized in that the radiation-sensitive coating is partially exposed to first actinic radiation prior to the baking step;

the predetermined value of the sensitizer decomposition is sufficiently low that the previously unexposed radiation-sensitize coating remains sensitive to actinic radiation;

and the previously unexposed radiation-sensitive coating is exposed to second actinic radiation after the baking step.

8. The method of claim 6 further characterized in that the reaction results in a decomposition of a photoactive compound in the radiation-sensitive coating, and the computer is used to control withdrawal of the substrate when the decomposition of the photoactive compound has reached a predetermined value.

9. The method of claim 1 further characterized in that the first portion of the film initially contains a first concentration $c_o^d$ of a photoactive compound, and after baking the first portion of the film contains a second concentration $c_f^d$ of said photoactive compound;

and the computer is used to control the withdrawal of the substrate when the ratio $c_f^d/c_o^d$ reaches a predetermined value.

10. The method of claim 6 further characterized in that before baking the radiation sensitive coating contains a first concentration $c_o^d$ of a photoactive compound and after a baking the coating contains a second concentration $c_f^d$ of said photoactive compound, and the computer is used to control withdrawal of the substrate when the ratio $c_f^d/c_o^d$ reaches a predetermined value.

* * * * *

UNITED STATES PATENT AND TRADEMARK OFFICE
CERTIFICATE OF CORRECTION

PATENT NO. : 4,814,243

DATED : March 21, 1989

INVENTOR(S) : D. H. Ziger

It is certified that error appears in the above—identified patent and that said Letters Patent is hereby corrected as shown below:

Column 4, Line 25 (Equation 2) should include the integration symbols as follows:

$$\int_{c_o^d}^{c_f^d} \frac{dc}{f(c)} = \int_o^{t_f} g(T)\, dt \qquad (2)$$

Column 4, Line 48, "$R_T$" should read --RT--.

Column 4, Line 55 (Equation 5) should include the integration symbol as follows:

$$\ln \frac{c_f^d}{c_o^d} = \int_o^{t_f} -A^d \exp \frac{-E_a^d}{RT}\, dt \qquad (5)$$

Column 5, Line 58 (Equation 8) should include the integration symbol as follows:

$$\ln \frac{c_f^a}{c_0^a} = -A^a \int_{t=t_0}^{t=t_f} \exp\left(\frac{-E_a^a}{RT}\right) dt \qquad (8)$$

Column 6, Line 3 should include the integration symbol as follows:

$$I = \int_{t=t_0}^{t=t_f} \exp\left(\frac{-E_a^a}{RT}\right) dt$$

UNITED STATES PATENT AND TRADEMARK OFFICE
CERTIFICATE OF CORRECTION

PATENT NO. : 4,814,243
DATED : March 21, 1989
INVENTOR(S) : D. H. Ziger

Figure 3:
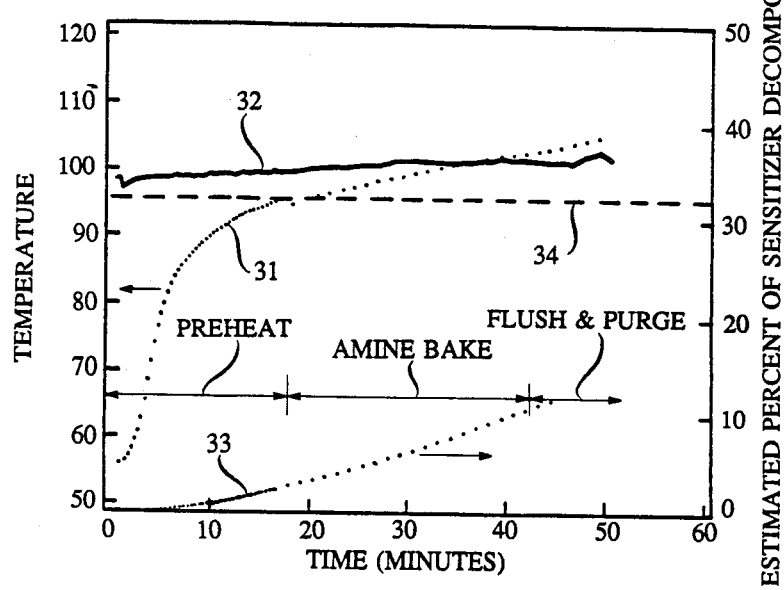
FIG. 3 is a graph of temperature versus time and also of sensitizer decomposition versus time in an image reversal processing method of the apparatus of FIG. 2.

It is certified that error appears in the above—identified patent and that said Letters Patent is hereby corrected as shown below:

Column 6, Line 27, after "result." add:

--Referring to FIG. 3, curve 31 shows the wafer temperature plot recorded by a wafer thermocouple in an oven having the nominal temperature shown by curve 32. When the wafer temperature crosses a threshold shown by temperature line 34, it triggers the amine bake cycle. During the heating step, the sensitizer decomposes as shown by curve 33. When the decomposition reaches a predetermined value, such as 10 percent (designated by the right-most ordinate), the bake cycle stops, the wafer is withdrawn and the oven is triggered to the flush and purge cycle. The predetermined value of percent of sensitizer decomposition corresponds to $\dfrac{C_f^d}{C_o^d}$ of equation (5).--

Column 6, Line 29, "devicsed" should read --devised--.

Signed and Sealed this

Thirty-first Day of October, 1989

*Attest:*

DONALD J. QUIGG

*Attesting Officer*     *Commissioner of Patents and Trademarks*